United States Patent
Guo et al.

(10) Patent No.: US 10,345,371 B2
(45) Date of Patent: Jul. 9, 2019

(54) METHOD FOR PARAMETER EXTRACTION OF A SEMICONDUCTOR DEVICE

(71) Applicant: NATIONAL CHIAO TUNG UNIVERSITY, Hsinchu (TW)

(72) Inventors: Jyh-Chyurn Guo, Hsinchu County (TW); Yen-Ying Lin, Tainan (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 471 days.

(21) Appl. No.: 15/351,626

(22) Filed: Nov. 15, 2016

(65) Prior Publication Data
US 2017/0242065 A1 Aug. 24, 2017

(30) Foreign Application Priority Data
Feb. 22, 2016 (TW) .............................. 105105078 A

(51) Int. Cl.
G01R 31/26 (2014.01)
G06F 17/50 (2006.01)
H01L 29/78 (2006.01)
H01L 21/66 (2006.01)

(52) U.S. Cl.
CPC ..... *G01R 31/2621* (2013.01); *G06F 17/5036* (2013.01); *G06F 17/5081* (2013.01); *H01L 22/14* (2013.01); *H01L 29/7833* (2013.01)

(58) Field of Classification Search
CPC .................................................. G01R 31/2621
See application file for complete search history.

(56) References Cited

U.S. PATENT DOCUMENTS

| | | | | |
|---|---|---|---|---|
| 5,773,317 A | * | 6/1998 | Wu | H01L 22/34 438/14 |
| 6,166,558 A | * | 12/2000 | Jiang | H01L 22/12 257/E21.53 |
| 6,275,972 B1 | | 8/2001 | Long et al. | |
| 6,295,630 B1 | * | 9/2001 | Tamegaya | G06F 17/5036 257/E21.53 |
| 2002/0073387 A1 | * | 6/2002 | Tsai | G01R 27/28 716/115 |
| 2012/0197593 A1 | * | 8/2012 | Guo | G01R 31/2648 702/170 |
| 2013/0117001 A1 | * | 5/2013 | Goo | G06F 17/5036 703/13 |

(Continued)

OTHER PUBLICATIONS

S. Severi, et al., "Accurate Channel Length Extraction by Split C-V Measurements on Short-Channel MOSFETs," IEEE Electron Device Letters, vol. 27, No. 7, pp. 615-618, Jul. 2006.

(Continued)

*Primary Examiner* — Manuel L Barbee
*Assistant Examiner* — Raymond L Nimox
(74) *Attorney, Agent, or Firm* — Nixon & Vanderhye P.C.

(57) ABSTRACT

A method is provided for parameter extraction of a semiconductor device with a multi-finger gate. The method includes measuring gate-to-source and gate-to-drain capacitances and performing 3D simulation to compute fringing capacitances, thereby computing an overlap capacitance between the gate and a source/drain extension region, and computing a length of the source/drain extension region according to the overlap capacitance.

13 Claims, 6 Drawing Sheets

(56) References Cited

U.S. PATENT DOCUMENTS

2013/0117002 A1* 5/2013 Goo .................. G06F 17/5036
703/13

OTHER PUBLICATIONS

Chen-Yu Hsieh & Ming-Jer Chen, "Electrical Measurement of Local Stress and Lateral Diffusion Near Source/Drain Extension Corner of Uniaxially Stressed n-MOSFETs," IEEE Transactions on Electron Devices, vol. 55, No. 3, pp. 844-849, Mar. 2008.
Dominique Fleury, et al., "Automatic Extraction Methodology for Accurate Measurements of Effective Channel Length on 65-nm MOSFET Technology and Below," IEEE Transactions on Semiconductor Manufacturing, vol. 21, No. 4, pp. 504-512, Nov. 2008.

* cited by examiner

METHOD FOR PARAMETER EXTRACTION OF A SEMICONDUCTOR DEVICE

CROSS-REFERENCE TO RELATED APPLICATION

This application claims priority of Taiwanese Patent Application No. 105105078, filed on Feb. 22, 2016.

FIELD

The disclosure relates to a method for parameter extraction of a semiconductor device, and more particularly to a method for extracting parameters associated with a gate, a source-drain extension region and channel of a metal-oxide-semiconductor field-effect transistor (MOSFET).

BACKGROUND

In radio frequency (RF) circuit design, nano-scale multi-finger (MF) MOSFETs are widely used since use of the multi-finger structure may effectively reduce gate resistance by changing the finger width and the finger number (i.e., number of fingers) of the gate fingers, thereby achieving a higher maximum oscillation frequency and lower noise at high frequency.

With miniaturization of the devices to nano-scale dimensions, the source/drain extension (SDE) region may introduce significant impact on some important device parameters, such as electrical integrity, subthreshold leakage current, overlap capacitance, etc. An ultra-shallow junction (USJ) of the SDE region may effectively suppress the short channel effects (SCE), but may increase the resistance of the SDE region and degrade the driving current. In addition, a length of an overlapping region between the gate and the SDE region ($L_{SDE}$) is an important parameter to be known accurately because an effective channel length ($L_{ch}$) is obtained by subtracting the length of the overlapping region ($L_{SDE}$) from the gate length ($L_g$). In case that the gate length ($L_g$) is fixed, a longer length of the overlapping region ($L_{SDE}$) may lead to a shorter effective channel length ($L_{ch}$) and thus a larger leakage current from the source to the drain.

A conventional method for extracting the gate length ($L_g$) and the length of the overlapping region ($L_{SDE}$) is to provide two test pieces on which semiconductor devices (e.g., MOSFETs) with the same layout dimension are disposed, to use a scanning electron microscope (SEM) to measure gate lengths of the semiconductor devices on one of the test pieces, and to perform electrical measurement on the semiconductor devices on the other one of the test pieces, thereby determining the length of the overlapping region ($L_{SDE}$). However, the semiconductor devices on different test pieces might not have the same gate length even with the same layout dimension due to process variation, which may become more prominent with miniaturization of the devices, causing excessive differences among nano-scale devices. Moreover, the destructive SEM measurement is time-consuming and generates extra material cost while the reproducibility of measurement cannot be ensured. Furthermore, in conventional parameter extraction methods, two-dimensional conditions are usually considered, while three-dimensional effects, such as poly finger-end fringing capacitance, may be overlooked. Such conventional methods are inapplicable to the multi-finger gate devices.

In order to enhance the precision of electrical analysis and simulation for the semiconductor devices, especially the nano-scale devices, it is a goal in relevant industry to precisely extract the length of the overlapping region ($L_{SDE}$) and the effective channel length ($L_{ch}$) of the multi-finger gate devices.

SUMMARY

Therefore, an object of the disclosure is to provide a high-precision parameter extraction method for a semiconductor device that has a source, a drain and a multi-finger gate. The multi-finger gate includes a plurality of gate fingers. Each of the source and the drain has a plurality of active regions each of which corresponds to a corresponding one of the gate fingers, and a plurality of extension regions each of which corresponds to a corresponding one of the gate fingers. Each of the extension regions of the source and the drain partly overlaps the corresponding one of the gate fingers to form an extension overlapping region.

According to the disclosure, the method includes steps of: acquiring a channel capacitance per unit area and an effective total channel width of the semiconductor device; configuring the semiconductor device to be in a specified state, measuring the semiconductor device in the specified state to obtain Y-parameters of the semiconductor device in the specified state, and performing open de-embedding on the Y-parameters of the semiconductor device in the specified state to acquire a gate-to-drain capacitance and a gate-to-source capacitance of the semiconductor device; performing a three-dimensional (3D) capacitance simulation to compute a gate sidewall fringing capacitance and a poly finger-end fringing capacitance of the semiconductor device; computing an overlap capacitance between the source-drain extension region and the multi-finger gate according to the gate-to-drain capacitance, the gate-to-source capacitance, the gate sidewall fringing capacitance and the poly finger-end fringing capacitance; and computing a length of the extension overlapping region of the semiconductor device according to the channel capacitance per unit area, the effective total channel width and the overlap capacitance.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
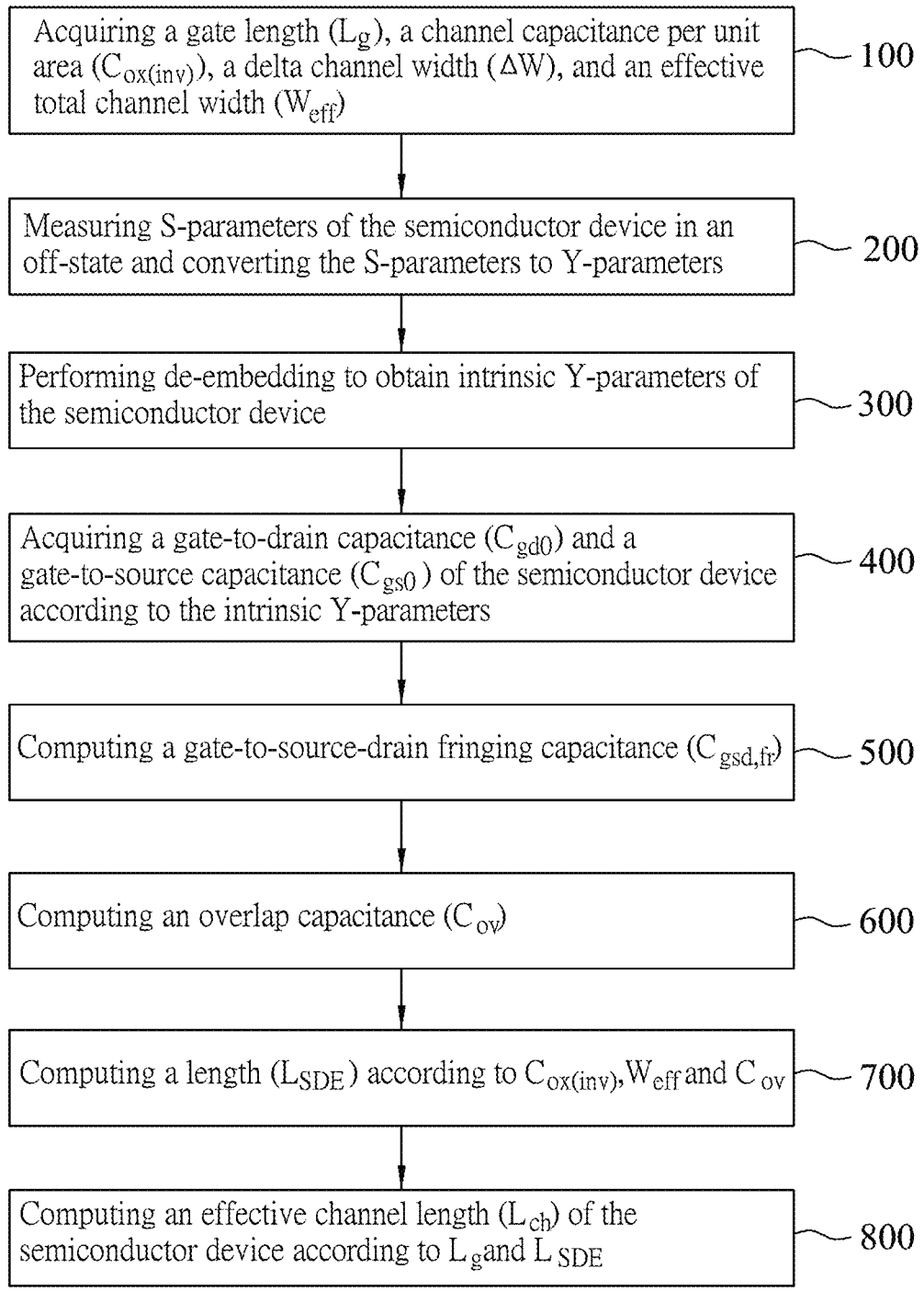
FIG. 1 is a flow chart illustrating steps of an embodiment of a parameter extraction method according to this disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
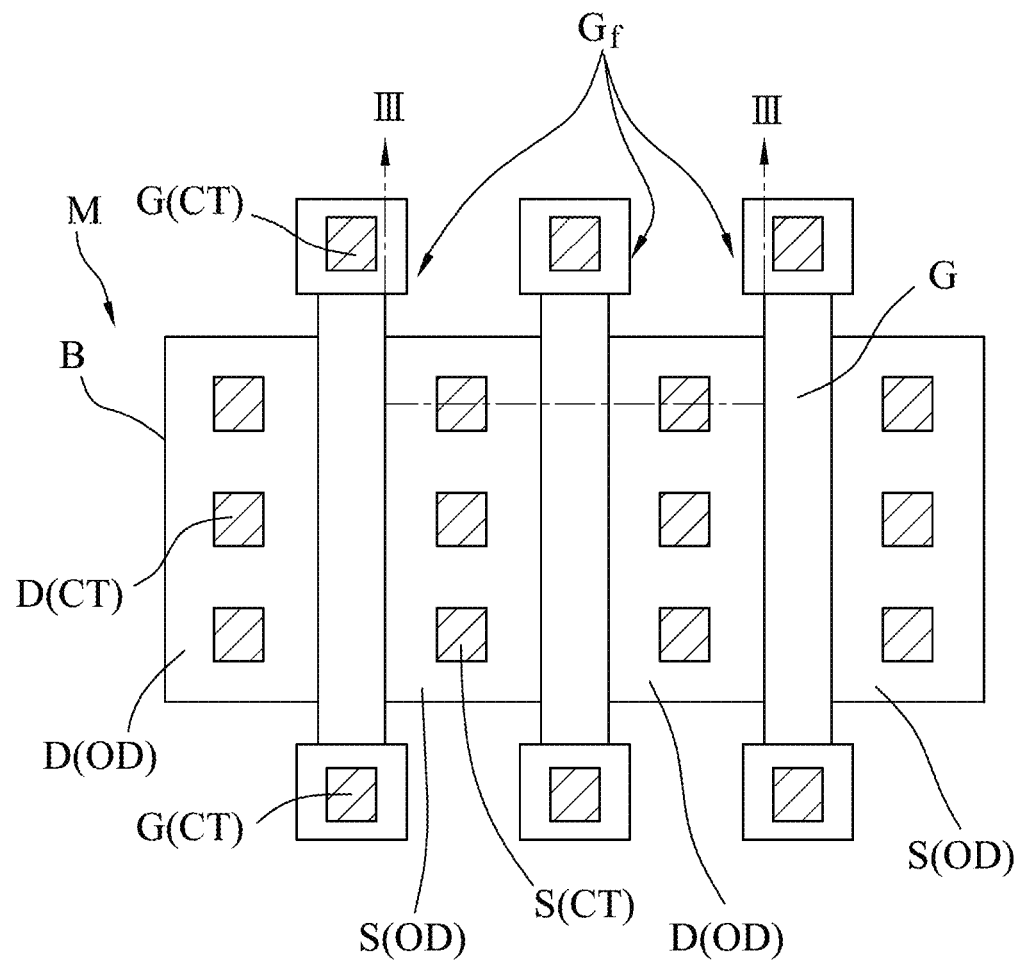
FIG. 2 is a schematic diagram illustrating a semiconductor device with a multi-finger gate of this embodiment.
Figure 3:
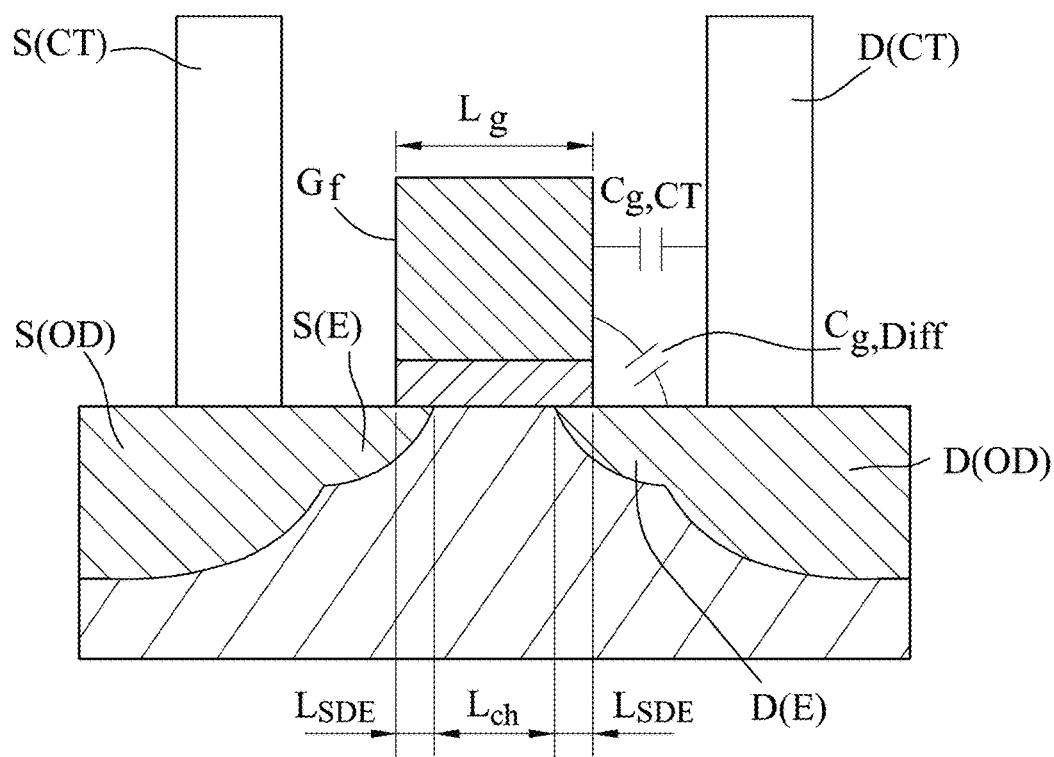
FIG. 3 is a sectional view of the semiconductor device along line III-III in FIG. 2.

Referring to FIGS. 1-3, an embodiment of the method for parameter extraction of a semiconductor device (M) according to this disclosure includes steps 100 to 800, and relevant computations thereof may be performed using a computer. In this embodiment, the semiconductor device (M) is a nano-scale MOSFET that has a multi-finger gate (G), a source (S), a drain (D), and a body (B). The multi-finger gate (G) includes a plurality of gate fingers ($G_f$) spaced apart from each other along a predetermined direction. Each gate finger ($G_f$) has two gate contacts (G(CT)) respectively disposed at opposite end portions thereof. Each of the source and the drain has a plurality of active regions (S(OD), D(OD)), a plurality of extension region (S(E), D(E)) (only one extension region (S(E)) and one extension region (D(E)) are visible in FIG. 3), and a plurality of contacts (S(CT), D(CT)) disposed on top of the active regions (S(OD), D(OD)) thereof. Each of the gate fingers ($G_f$) corresponds to one of the active regions (S(OD)) and one of the extension regions (S(E)) of the source and one of the active regions (D(OD)) and one of the extension regions (D(E)) of the drain. In this embodiment, for each gate finger ($G_f$), the corresponding active region (S(OD)) and extension region (S(E)) of the source and the corresponding active region (D(OD)) and extension region (D(E)) of the drain are symmetrical with respect to the gate finger ($G_f$), as shown in FIG. 3. Each of the extension regions (S(E), D(E)) of the source and the drain partly overlaps the corresponding gate finger ($G_f$) to form an extension overlapping region having a length ($L_{SDE}$). The embodiment of the parameter extraction method may be provided for extracting parameters of the length of the extension overlapping region ($L_{SDE}$) and an effective channel length ($L_{ch}$) for each gate finger ($G_f$).

In step 100, a method proposed in U.S. Pat. No. 8,691,599 may be applied to acquire a gate length ($L_g$), a channel capacitance per unit area ($C_{ox(inv)}$), a delta channel width ($\Delta W$) resulting from a shallow trench isolation (STI) process, and an effective total channel width ($W_{eff}$) of the semiconductor device (M). The steps of acquiring the above-mentioned parameters according to U.S. Pat. No. 8,691,599 are briefly described hereinafter.

Figure 4:
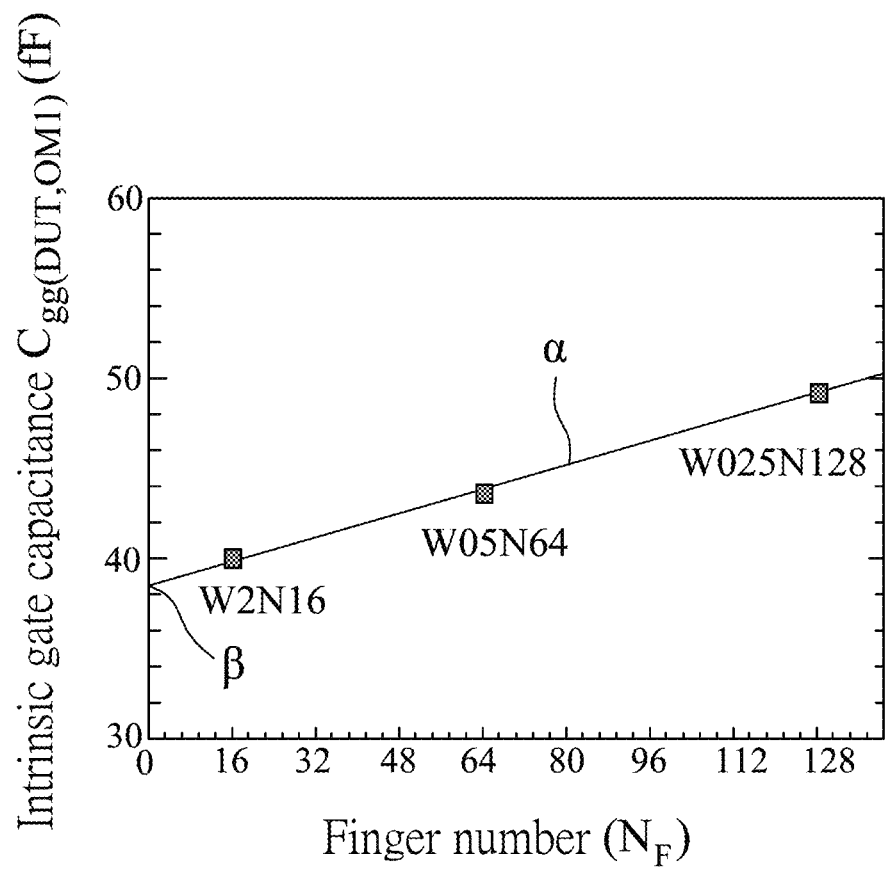
FIG. 4 is a plot illustrating an exemplary relationship between intrinsic gate capacitance and finger number.

In order to enhance the precision and reliability, a long channel device that has a single finger structure and at least two multi-finger gate devices are provided in this method. In this embodiment, three multi-finger gate devices, which are respectively first, second and third multi-finger gate devices, are provided. The first, second and third multi-finger gate devices have different finger numbers but have the same total channel width ($W_{tot}$), which is defined to be $W_{tot}=W_{F1}\times N_{F1}=W_{F2}\times N_{F2}=W_{F3}\times N_{F3}$, where $W_{F1}$, $W_{F2}$, and $W_{F3}$ represent the finger widths of each gate finger of the first, the second, and the third multi-finger gate devices, respectively, and $N_{F1}$, $N_{F2}$ and $N_{F3}$ represent the finger numbers of the first, the second, and the third multi-finger gate devices, respectively. Then, de-embedding on Y-parameters of the first, the second, and the third multi-finger gate devices is performed to get the first, the second, and the third intrinsic gate capacitances, respectively. As exemplified in FIG. 4, a linear function may be determined according to the first intrinsic gate capacitance, the second intrinsic gate capacitance, the third intrinsic gate capacitance, and the finger numbers of the first, the second, and the third multi-finger gate devices, so as to compute a slope ($\alpha$) and a y-intercept ($\beta$) of the linear function. A high-frequency test apparatus such as a vector network analyzer may be used to measure the long channel device to obtain the channel capacitance per unit area ($C_{ox(inv)}$). A three-dimensional (3D) interconnect simulation software may be executed in the computer to perform 3D capacitance simulation to compute a poly finger-end fringing capacitance ($C_{f(poly-end)}$) and a gate sidewall fringing capacitance ($C_{of}$) of the semiconductor device (M). In this embodiment, the 3D capacitance simulation is performed using "Raphael", which is developed by Synopsys Inc., but this disclosure is not limited thereto. In detail, a 3D structure of the semiconductor device (M) is built according to device layout and process parameters for the 3D capacitance simulation, to compute the capacitances between sidewalls of the gate fingers ($G_f$) and the active regions of the source and the drain (S(OD), D(OD)), collectively denoted hereinafter by $C_{g,Diff}$, the capacitances between the sidewalls of the gate fingers ($G_f$) and the drain contacts (D(CT)) and between the sidewalls of the gate fingers ($G_f$) and the source contacts (S(CT)), collectively denoted hereinafter by $C_{g,CT}$, the capacitances between the gate contacts (G(CT)) and the active regions (S(OD), D(OD)) of the source and the drain, collectively denoted hereinafter by $C_{gCT,Diff}$, and the capacitances between the gate contacts (G(CT)) and the drain contacts (D(CT)) and between the gate contacts (G(CT)) and the source contacts (S(CT)), collectively denoted hereinafter by $C_{gCT,CT}$. The gate sidewall fringing capacitance ($C_{of}$) of the semiconductor device (M) is a sum of the $C_{g,CT}$ and $C_{g,Diff}$ as described by the following equation (1).

$$C_{of}=C_{g,CT}+C_{g,Diff} \quad (1)$$

The poly finger-end fringing capacitance ($C_{f(poly-end)}$) is a sum of the fringing capacitance from the poly finger-end and the above contacts to the source and drain contacts ($C_{poly-end,CT}$) and fringing capacitance from the poly finger-end and the above contacts to the source and drain diffusion regions ($C_{poly-end,Diff}$) as described by equation (2) below.

$$C_{f(poly-end)}=C_{poly-end,CT}+C_{poly-end,Diff} \quad (2)$$

The delta channel width ($\Delta W$) is then computed according to the slope ($\alpha$), the poly finger-end fringing capacitance ($C_{f(poly-end)}$) and the channel capacitance per unit area ($C_{ox(inv)}$), to thus compute the effective total channel width ($W_{eff}$) of the semiconductor device (M) according to:

$$W_{eff}=(W_F+\Delta W)\times N_F \quad (3),$$

where $W_F$ represents a finger width of each gate finger ($G_f$), and $N_F$ represents the number of the multiple gate fingers.

It is noted that, since the long channel device has the single finger structure, and a finger length (i.e., a gate length) and a finger width thereof are much greater than those of each of the first, the second, and the third multi-finger gate devices, critical dimension variation resulting from manufacturing process may be ignored, and the obtained channel capacitance per unit area is thus reliable.

Basically, the gate length of the long channel device can be deemed equal to a layout gate length of the long channel device, so extraction is unnecessary. However, for a multi-finger gate device, the layout gate length is provided according to a design minimum rule, so a difference between the layout gate length and the actual gate length cannot be ignored (i.e., the layout gate length is not equal to the actual gate length). Based on a device structure disclosed in U.S. Pat. No. 8,691,599, the following steps may be used to approach the actual gate length of a multi-finger gate device (e.g., the semiconductor device (M)).

A relationship between the y-intercept (β) (see FIG. 4) and the gate length may be described by:

$$\beta = (C_{ox(inv)} L_g + C_{of}) W_{tot} \quad (4),$$

where $W_{tot}$ represents a total channel width of the semiconductor device (M). Further, the total channel width ($W_{tot}$) may be described by the following equation.

$$W_{tot} = W_F \times N_F \quad (5)$$

According to equation (4), the following relationships may be derived.

$$C_{of} = \frac{\beta}{W_{tot}} - C_{ox(inv)} L_g \quad (6)$$

$$L_g = \frac{\beta}{W_{tot} C_{ox(inv)}} - \frac{C_{of}}{C_{ox(inv)}} \quad (7)$$

Figure 5:
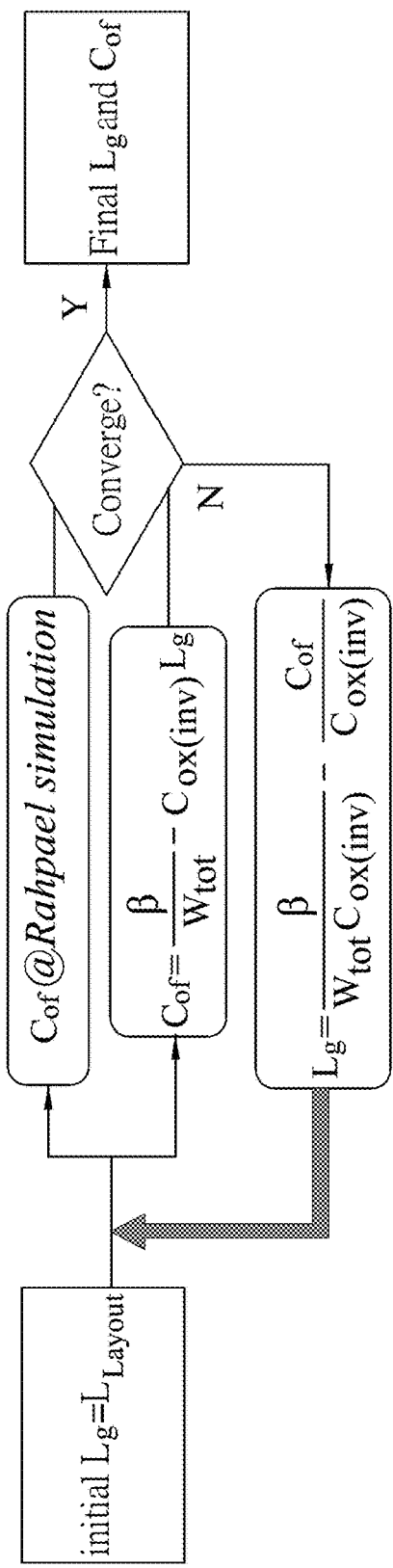
FIG. 5 is a flow chart illustrating a process of approaching an actual gate length and an actual gate sidewall fringing capacitance.

FIG. 5 shows a flow chart in accordance with which the actual gate length ($L_g$) and the gate sidewall fringing capacitance ($C_{of}$) may be approached with high precision. At first, the layout gate length ($L_{Layout}$) is set as an initial value for the gate length ($L_g$) to perform 3D capacitance simulation (e.g., Raphael simulation) in cooperation with equation (1) to acquire a simulated gate sidewall fringing capacitance ($C_{of}$), and to perform computation of equation (6) to acquire a computed gate sidewall fringing capacitance ($C_{of}$). Then, the gate length ($L_g$) is computed by equation (7) in which the $C_{of}$ comes from the simulation, and the initial gate length is replaced by this computed $L_g$. The updated $L_g$ is used to redo the 3D capacitance simulation and update the simulated Cr. If this updated $C_{of}$ is close to the computed $C_{of}$ given by equation (6), it means that the updated $L_g$ is close to the actual $L_g$. Going through the mentioned iteration flow illustrated in FIG. 5, until the simulated $C_{of}$ and computed $C_{of}$ converge to an identical value, the most updated $L_g$ is the actual $L_g$.

In general, the initial value should have a great difference from the actual gate length, and thus it is proposed to iteratively perform the 3D capacitance simulation and the computation of equations (7) and (6) to update the gate length ($L_g$) and the gate sidewall fringing capacitance ($C_{of}$) for approaching the actual gate length and the actual gate sidewall fringing capacitance. In detail, the simulated gate sidewall fringing capacitance serves as $C_{of}$ in equation (7) to compute a first updated gate length. The first updated gate length is then used for the 3D capacitance simulation to obtain a first updated simulated gate sidewall fringing capacitance. Then, a determination of whether or not the iterative simulation and computation should keep going is made according to a difference between the first updated simulated gate sidewall fringing capacitance and the original simulated gate sidewall fringing capacitance. These steps continue until a latest simulated gate sidewall fringing capacitance and a most recently updated computed gate sidewall fringing capacitance almost converge to a same value. The criterion of convergence may be defined by a difference equal to or less than 0.05%. At this time, a gate length ($L_g$) obtained by using the latest simulated gate sidewall fringing capacitance in equation (7) should approximately be the actual gate length, and is reliable to serve as the actual gate length in the following computation. It is noted that an experimental number of the abovementioned iterative simulation and computation to achieve convergence is six iterations or less in general. The abovementioned iterative operations may be literally described using the following steps.

In the beginning, the layout gate length ($L_{Layout}$) is used as an initial value for the gate length $L_g$. In a first step, this initial gate length ($L_g$) is used to perform computation of the equation (6) to acquire a first computed $C_{of}$. Also, this initial $L_g$ is taken into the 3D capacitance simulation to achieve a first simulated $C_{of}$. In a second step, the first simulated $C_{of}$ is placed into equation (7) to obtain a first updated $L_g$. Also, this first updated $L_g$ is taken into equation (6) to achieve the second computed $C_{of}$. Then, a comparison between the first simulated $C_{of}$ and the second computed $C_{of}$ is made to examine if the difference therebetween can meet the convergence criterion, such as being equal to or less than 0.05%. In case that it can meet the convergence criterion, no further iteration is necessary; and thus, this first updated $L_g$ is taken as the actual $L_g$ and the second computed $C_{of}$ is taken as the actual $C_{of}$. Otherwise, the iteration flow has to be continued until the difference between the simulated $C_{of}$ and computed $C_{of}$ can meet the convergence criterion.

Figure 6:
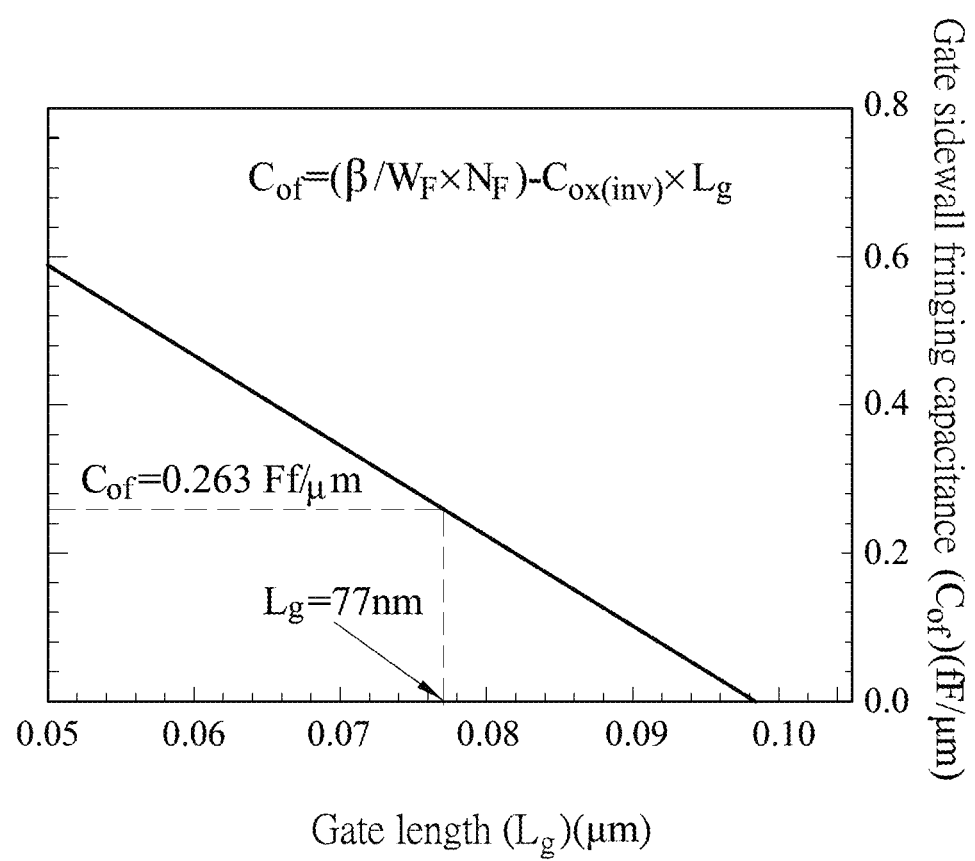
FIG. 6 is a plot illustrating an exemplary relationship between gate length and gate sidewall fringing capacitance for multi-finger gate devices.

FIG. 6 shows a relationship between the gate length ($L_g$) and gate sidewall fringing capacitance ($C_{of}$) acquired according to the flow chart in FIG. 5 for a multi-finger gate device fabricated using 90 nm CMOS manufacturing process.

In step 200, the semiconductor device (M) is configured in a specified off-state in which a gate voltage, a source voltage, a drain voltage and a body voltage are all set to be 0V, and the high-frequency test apparatus (e.g., the abovementioned vector network analyzer) is used to measure S-parameters of the semiconductor device (M) in the off-state with the gate contacts (G(CT)) assigned to be port-1 and the drain contacts (D(CT)) assigned to be port-2 during measurement. Through transfer matrices, the S-parameters of the semiconductor device (M) may be converted to Y-parameters.

When the semiconductor device (M) operates at a high frequency, characteristic thereof, such as the S-parameters, may be affected by parasitic components from, for instance, the probes, the metal layers, and the silicon substrate underneath. In order to eliminate influence from the parasitic components, an open de-embedding on the Y-parameters of the semiconductor device (M) thus converted is performed in step 300 to obtain the intrinsic Y-parameters of the semiconductor device (M). In detail, a dummy open test structure is formed by removing the gate fingers ($G_f$), the active regions and the contacts of the source (S(OD) and S(CT)), and the active regions and the contacts of the drain (D(OD) and D(CT)) of the semiconductor device (M). More details of the dummy open test structure may be found in U.S. Pat. No. 8,691,599, and are omitted herein for the sake of brevity. During the de-embedding process, the high frequency test apparatus is used to measure S-parameters of the dummy open test structure (GSG pads only, without devices), namely open S-parameter, followed by converting the open S-parameters into open Y-parameters, and subtracting the open Y-parameters from the Y-parameters of the semiconductor device (M) with GSG pads obtained in step 200 to compute the intrinsic Y-parameters of the semiconductor device (M).

In step 400, a gate-to-drain capacitance ($C_{gd0}$) and agate-to-source capacitance ($C_{gs0}$) of the semiconductor device (M) is acquired according to:

$$C_{gd0} = C_{gs0} = -\frac{\text{Im}(Y_{12})}{\omega}\bigg|_{V_{DS}=V_{OS}=0\,V}, \quad (8)$$

where ω represents an angular frequency, and Im($Y_{12}$) is an imaginary part of $Y_{12}$, from capacitive coupling between the multi-finger gate (G) and the drain. In this embodiment, the semiconductor device (M) is designed as a general CMOS device that the source and the drain are structurally symmetric with respect to the gate, and thus, in the off-state (i.e., $V_{DS}=V_{GS}=0V$), the gate-to-drain capacitance ($C_{gd0}$) and the gate-to-source capacitance ($C_{gs0}$) should be identical. Therefore, by setting the semiconductor device (M) in the off-state, the acquired gate-to-drain capacitance ($C_{gd0}$) is the same as the gate-to-source capacitance ($C_{gs0}$). Accordingly, a sum ($C_{gsd0}$) of the gate-to-drain capacitance ($C_{gd0}$) and the gate-to-source capacitance ($C_{gs0}$) is computed according to the following.

$$C_{gsd0} = C_{gd0} + C_{gs0} = -2\frac{\text{Im}(Y_{12})}{\omega}\bigg|_{V_{DS}=V_{OS}=0\,V} \quad (9)$$

It is noted that $C_{gsd0}$ contains a gate-to-source-drain fringing capacitance ($C_{gsd,fr}$) between the multi-finger gate (G) and the active regions of the source and the drain (S(OD), D(OD)), and an overlap capacitance ($C_{ov}$) between the multi-finger gate (G) and the extension regions of the source and the drain (S(E), D(E)). Such relationship may be described by equation (10) below.

$$C_{gsd0} = C_{gsd,fr} + C_{ov} \quad (10)$$

In step 500, the gate-to-source-drain fringing capacitance ($C_{gsd,fr}$) is computed according to:

$$C_{gsd,fr} = C_{of} \times W_{eff} + C_{f(poly\text{-}end)} \times N_F \quad (11),$$

where the gate sidewall fringing capacitance ($C_{of}$), the poly finger-end fringing capacitance ($C_{f(poly\text{-}end)}$) and the effective total channel width ($W_{eff}$) may be respectively obtained by equations (1) to (3).

In step 600, based on equation (10) in cooperation with equations (9) and (11), the overlap capacitance ($C_{ov}$) is computed according to the following equation (12).

$$C_{OV} = -2\frac{\text{Im}Y_{12}}{\omega} - C_{of} \times W_{eff} - C_{d(poly\_end)} \times N_F \quad (12)$$

In step 700, the length ($L_{SDE}$) of each extension overlapping region of the semiconductor device (M) is computed according to the channel capacitance per unit area ($C_{ox(inv)}$), the effective total channel width ($W_{eff}$) and the overlap capacitance ($C_{ov}$) as follows.

$$L_{SDE} = \frac{C_{OV}}{2C_{ox(inv)}W_{eff}} \quad (13)$$

Finally, in step 800, an effective channel length ($L_{ch}$) of the semiconductor device (M) may be computed according to:

$$L_{ch} = L_g - 2L_{SDE} \quad (14),$$

where $L_g$ is the gate length obtained according to the flow chart in FIG. 5.

In summary, the parameter extraction method of this disclosure uses non-destructive 3D capacitance simulation for predicting effects of the 3D structure of the semiconductor device (M) on gate fringing capacitance, and for precisely determining the gate sidewall fringing capacitance ($C_{of}$) and the poly finger-end fringing capacitance ($C_{f(poly\text{-}end)}$), thereby acquiring the length of each extension overlapping region ($L_{SDE}$) and the effective channel length ($L_{ch}$) with high precision. Accordingly, such method is applicable to MOSFETs with various layouts and big dimensions.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for parameter extraction of a semiconductor device that has a source, a drain and a multi-finger gate; the multi-finger gate including a plurality of gate fingers; each of the source and the drain having a plurality of active regions each of which corresponds to a corresponding one of the gate fingers, and a plurality of extension region each of which corresponds to a corresponding one of the gate fingers; each of the extension regions of the source and the drain partly overlapping the corresponding one of the gate fingers to form an extension overlapping region, said method comprising:

(a) acquiring a channel capacitance per unit area and an effective total channel width of the semiconductor device;

(b) configuring the semiconductor device to be in a specified state, measuring the semiconductor device in the specified state to obtain Y-parameters of the semiconductor device in the specified state, and performing open de-embedding on the Y-parameters of the semiconductor device in the specified state to acquire a gate-to-drain capacitance and a gate-to-source capacitance of the semiconductor device;

(c) performing three-dimensional (3D) capacitance simulation to compute a gate sidewall fringing capacitance and a poly finger-end fringing capacitance of the semiconductor device;

(d) computing an overlap capacitance between the source-drain extension region and the multi-finger gate according to the gate-to-drain capacitance, the gate-to-source capacitance, the gate sidewall fringing capacitance and the poly finger-end fringing capacitance; and (e) computing a length of the extension overlapping region of the semiconductor device according to the channel capacitance per unit area, the effective total channel width and the overlap capacitance.

2. The method of claim 1, wherein (b) includes:
measuring S-parameters of the semiconductor device in the specified state, and converting the S-parameters to the Y-parameters;
performing the open de-embedding on the Y-parameters of the semiconductor device in the specified state to obtain intrinsic Y-parameters of the semiconductor device according to the Y-parameters; and
computing the gate-to-drain capacitance and the gate-to-source capacitance of the semiconductor device according to the intrinsic Y-parameters.

3. The method of claim 2, wherein the specified state is an off-state in which the multi-finger gate, the source, the drain and a body of the semiconductor device are set to have a same voltage.

4. The method of claim 3, wherein (d) includes:
computing a gate-to-source-drain fringing capacitance according to the gate sidewall fringing capacitance and the poly finger-end fringing capacitance;
computing a sum of the gate-to-drain capacitance and the gate-to-source capacitance; and
computing the overlap capacitance by subtracting the gate-to-source-drain fringing capacitance from the sum of the gate-to-drain capacitance and the gate-to-source capacitance.

5. The method of claim 4, wherein the gate-to-source-drain fringing capacitance is computed according to:

$$C_{gsd,fr} = C_{of} \times W_{eff} + C_{f(poly\text{-}end)} \times N_F,$$

where $C_{gsd,fr}$ represents the gate-to-source-drain fringing capacitance, $C_{of}$ represents the gate sidewall fringing capacitance, $C_{f(poly\text{-}end)}$ represents the poly finger-end fringing capacitance, $W_{eff}$ represents the effective channel width, and $N_F$ represent a finger number of the multi-finger gate.

6. The method of claim 1, further comprising: (f) computing an effective channel length of the semiconductor device according to the length of the extension overlapping region and a gate length of the semiconductor device.

7. The method of claim 1, the source further having a plurality of source contacts on the active regions thereof, the drain further having a plurality of drain contacts on the active regions thereof, each of the gate fingers having two gate contacts respectively disposed at opposite end portions thereof, wherein in (c):
the gate sidewall fringing capacitance is a sum of capacitances between sidewalls of the gate fingers and the active regions of the source and the drain, and capacitances between the sidewalls of the gate fingers and the drain contacts and between the sidewalls of the gate fingers and the source contacts; and
the poly finger-end fringing capacitance is a sum of capacitances between the gate contacts and the active regions of the source and the drain, and capacitances between the gate contacts and the drain contacts and between the gate contacts and the source contacts.

8. The method of claim 1, wherein (a) includes:
(a-1) providing a first multi-finger gate device, a second multi-finger gate device and a long channel device, wherein the first multi-finger gate device has a first finger number of first gate fingers each having a first finger width, the second multi-finger gate device has a second finger number of second gate fingers each having a second finger width, and the long channel device has a gate length and a gate width, wherein $W_{F1} \times N_{F1} = W_{F2} \times N_{F2}$, and $N_{F1} \neq N_{F2}$, where $W_{F1}$ represents the first finger width, $W_{F2}$ represents the second finger width, $N_{F1}$ represents the first finger number, and $N_{F2}$ represents the second finger number;
(a-2) performing de-embedding on Y-parameters of the first multi-finger gate device to obtain a first intrinsic gate capacitance, performing de-embedding on Y-parameters of the second multi-finger gate device to obtain a second intrinsic gate capacitance, determining a linear function according to the first intrinsic gate capacitance, the second intrinsic gate capacitance, the first finger number and the second finger number, and computing a slope of the linear function;
(a-3) measuring by a high-frequency test apparatus the long channel device to obtain the channel capacitance per unit area;
(a-4) computing a delta channel width according to the slope, the poly finger-end fringing capacitance and the channel capacitance per unit area; and
(a-5) computing the effective total channel width according to a number of the gate fingers, a finger width of each of the gate fingers, and the delta channel width.

9. The method of claim 8, wherein (a-2) includes:
measuring by a high-frequency test apparatus the first multi-finger gate device to get a first gate capacitance, and measuring by a high-frequency test apparatus the second multi-finger gate device to get a second gate capacitance;
performing open de-embedding, to form a first dummy open test structure for the first multi-finger gate device and to form a second dummy open test structure for the second multi-finger gate device;
measuring by a high-frequency test apparatus the first dummy open test structure to get a first parasitic gate capacitance, and measuring by a high-frequency test apparatus the second dummy open test structure to get a second parasitic gate capacitance; and
computing the first intrinsic gate capacitance according to the first gate capacitance and the first parasitic gate capacitance, and computing a second intrinsic gate capacitance according to the second gate capacitance and the second parasitic gate capacitance.

10. The method of claim 9, wherein each of the first gate capacitance and the second gate capacitance is obtained by:
measuring by a high-frequency test apparatus S-parameters of the first multi-finger gate device, and S-parameters of the second multi-finger gate device;
converting the S-parameters of the first and the second multi-finger gate devices into the Y-parameters by transfer matrices; and
computing the first gate capacitance and the second gate capacitance according to the Y-parameters of the first and the second multi-finger gate devices.

11. The method of claim 8, further comprising: (f) acquiring a gate length of the semiconductor device by iteratively performing 3D capacitance simulation and computation of a first equation of:

$$C_{of} = \frac{\beta}{W_{tot}} - C_{ox(inv)} L_g,$$

where:
$W_{tot} = W_F \times N_F$, with $W_F$ representing a finger width of each of the gate fingers, and $N_F$ representing a finger number of the gate fingers; $L_g$ represents the gate length of the semiconductor device; $C_{of}$ represents the gate sidewall fringing capacitance; $C_{ox(inv)}$ represents the channel capacitance per unit area; and $\beta$ represents a y-intercept of the linear function.

12. The method of claim 11, wherein (f) includes:
(f-1) using a layout gate length as an initial value for the gate length $L_g$;
(f-2) using the gate length $L_g$ to perform computation of the first equation to acquire a computed gate sidewall fringing capacitance to serve as a first capacitance value;
(f-3) using the gate length $L_g$ to perform the 3D capacitance simulation in (f) to acquire a simulated gate sidewall fringing capacitance to serve as a second capacitance value;
(f-4) after (f-3), comparing the first capacitance value and the second capacitance value, and determining, according to a comparison result, whether the first capacitance value and the second capacitance value converge to a same value;
(f-5) when the determination in (f-4) is affirmative, determining the gate length according to the second capacitance value;
(f-6) when the determination in (f-4) is negative, performing computation of the first equation by making the second capacitance value serve as $C_{of}$ in the first equation to update the gate length; and
(f-7) updating the first capacitance value using the second capacitance value, and repeating (f-3) to update the second capacitance value using the gate length updated in (f-6).

13. The method of claim 11, further comprising: (g) computing an effective channel length of the semiconductor device according to the length of the extension overlapping region and the gate length of the semiconductor device.

* * * * *